(12) United States Patent
Babiarz et al.

(10) Patent No.: US 6,352,423 B1
(45) Date of Patent: Mar. 5, 2002

(54) APPARATUS FOR UNDERFILLING SEMICONDUCTOR DEVICES

(75) Inventors: Alec J. Babiarz; Carlos Edward Bouras; Drusilla Bertone Cursi, all of Encinitas; Alan Ray Lewis, Carlsbad; Jason Thomas Vint, La Mesa, all of CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/567,165

(22) Filed: May 8, 2000

Related U.S. Application Data

(62) Division of application No. 09/430,408, filed on Oct. 29, 1999, now Pat. No. 6,255,142.

(51) Int. Cl.⁷ .......................... H01L 21/44; B29C 45/14
(52) U.S. Cl. .................... 425/110; 264/272.17
(58) Field of Search .................. 438/126; 425/110, 425/405.1, 169; 264/272.17

(56) References Cited

U.S. PATENT DOCUMENTS

| | | | |
|---|---|---|---|
| 4,049,244 A | 9/1977 | Hedrich | 259/185 |
| 4,279,360 A | 7/1981 | Häuser | 222/1 |
| 5,147,660 A | 9/1992 | Steindorf | 425/148 |
| 5,203,076 A | 4/1993 | Banerji et al. | 29/840 |
| 5,218,234 A | 6/1993 | Thompson et al. | 257/787 |
| 5,382,394 A | 1/1995 | Terhardt | 264/40.7 |
| 5,385,869 A | 1/1995 | Liu et al. | 264/272.17 |
| 5,409,523 A | 4/1995 | Haeuser | 95/260 |
| 5,529,212 A | 6/1996 | Terhardt | 222/1 |
| 5,591,252 A | 1/1997 | Haeuser | 95/260 |
| 5,659,952 A | 8/1997 | Kovac et al. | 29/840 |
| 5,670,203 A | 9/1997 | Terhardt et al. | 427/58 |
| 5,932,254 A | 8/1999 | Mitchell et al. | 425/117 |
| 6,000,924 A | 12/1999 | Wang et al. | 425/125 |
| 6,048,656 A * | 4/2000 | Akram et al. | 438/127 |
| 6,080,605 A * | 6/2000 | Distefano et al. | 438/126 |
| 6,179,598 B1 * | 1/2001 | Brand | 425/110 |
| 6,220,503 B1 * | 4/2001 | Cox et al. | 228/265 |

FOREIGN PATENT DOCUMENTS

GB      2156247 A     10/1985

OTHER PUBLICATIONS

Derwent abstract of Research disclosure (RD–437047A) dated Sep. 10,2000.*

(List continued on next page.)

Primary Examiner—Robert Davis
(74) Attorney, Agent, or Firm—Wood, Herron & Evans, LLP

(57) ABSTRACT

A method and apparatus for underfilling a gap between a multi-sided semiconductor device and a substrate with viscous underfill material. The viscous underfill material is moved into the gap to encapsulate a plurality of electrical interconnections formed between the semiconductor device and the substrate. A seal is provided between the semiconductor device and the substrate to seal the gap along multiple sides of the device, while the gap is left unsealed along at least one side of the device to permit fluid communication with the gap. The viscous underfill material is dispensed adjacent the at least one side of the device along which the gap is unsealed, and a pressure differential is created across the underfill material to draw the underfill material into the gap and thereby encapsulate the electrical interconnections.

9 Claims, 3 Drawing Sheets

OTHER PUBLICATIONS

Wilhelm Hedrich Vacuumanlagen GmbH & Co. KG, *Hedrich "On–The–Fly" Degassi*, Wilhelm Hedrich Vacuumanlagen Sales Brochure, date unknown (2 pages).

Chris Lawing, Camelot Systems Inc., *Preventing Voids In uBGA® Packages*, Chip Scale Review, Mar. 1998 (pages 48–51).

Ron Iscoff, *Pushing The Envelope For the Next Generation of CSPs*, Chip Scale Review, Mar. 1998 (pp. 25–29).

New CSP Dispensing Systems Offer Fast, Void–Free Encapsulation and Craig Mitchell, Tessera, Inc., *Recent Advances In CSP Encapsulation*, Chip Scale Review, Mar. 1998, (pp. 9 and 56–59).

Mark J. Norris, *The Dispensing Process In Advanced Electronic Component Manufacturing Of Ball Grid Arrays, Flip Chip & Chip Scale Packages*, Pan Pacific Microelectronics Symposium, Feb. 10–13, 1998 (pp. 179–185).

Verfahrenstechnik Hübers GmbH, *Vacuum Casting Resin Plants*, Verfahrenstechnik Hübers GmbH Sales Brochure, date unknown (6 pages).

Chris Lawing, Camelot Systems, Inc., *Vacuum Dispensing Of Encapsulants For uBGA Manufacturing*, Electronic Packaging & Production, Feb. 1998 (pp. 87–91).

Wilhelm Hedrich Vacuumanlagen GmbH & Co. KG, *Vacuum Shot Dosing Equipment*, Wilhelm Hedrich Vacuumanlagen Sales Brochure, date unknown (pp. 1–40).

Wilhelm Hedrich Vacuumanlagen GmbH & Co. KG, *Vaccum Technology—Worldwide—For Tomorrow's Innovation*, Wilhelm Hedrich Vacuumanlagen Sales Brochure, date unknown (6 pages).

* cited by examiner

APPARATUS FOR UNDERFILLING SEMICONDUCTOR DEVICES

The present application is a divisional of U.S. Ser. No. 09/430,408, filed Oct. 29, 1999 and now U.S. Pat. No. 6,255,142 B1, the disclosure of which is hereby incorporated herein by reference in its entirety.

FIELD OF THE INVENTION

The present invention relates generally to liquid dispensing methods and apparatus used in semiconductor package manufacturing and, more particularly, to a method and apparatus for underfilling a semiconductor device mounted to a substrate.

BACKGROUND OF THE INVENTION

Manufacturers of semiconductor chip packages are constantly striving to develop smaller chip packages with enhanced capabilities. For example, flip chip technology has developed as a result of the movement toward ever increasing miniaturization of electronic circuitry. This technology is also known as direct chip attach or "DCA". It includes "flip chip" bonding, wherein a flip chip integrated circuit (IC) is electrically and mechanically connected to a substrate through solder balls on the underside of the flip chip that are registered or aligned with solder pads on the substrate.

Generally referring to FIGS. 1–3, it is well known that a semiconductor die or flip chip 10 is provided with a pattern of solder bumps or balls 12 on an underside or circuit side thereof. The solder balls 12 are registered or aligned with solder pads 14 on a PC board or similar substrate 16. The underside of the chip 10 is also referred to as the image side of the chip. Flux (not shown) is normally supplied between the solder balls 12 and solder pads 14. Upon heating, the solder pads 14 on the PC board or substrate 16 reflow and physically connect with the solder balls 12 on the underside of the chip 10. The solder balls 12 typically have a high melting point and therefore do not reflow. This connection is illustrated diagrammatically in FIG. 2 by deformed solder pad 14' mating with a solder ball 12. This process eliminates the requirement for wire bonding.

Special liquid epoxy 18 (FIG. 3) is typically used to completely fill the underside of the chip. This is referred to herein as the "underfill" operation. Upon curing, the resulting encapsulation forms a non-hygroscopic barrier to prevent moisture from contacting and thus corroding the electrical interconnects between the PC board 16 and the chip 10. The epoxy 18 also serves to protect the bonds between the deformed solder pads 14' and the solder balls 12 by providing thermal stress relief, i.e., accommodating different rates of thermal expansion and contraction.

Referring to FIG. 3 of the drawings, once the underfill operation is complete, it is desirable that enough liquid epoxy be deposited along the edges of the chip 10 to fully encapsulate all of the electrical interconnections and so that a fillet 18a is formed along the side edges of the chip 10. Normally, the liquid epoxy flows under the chip 10 as a result of capillary action due to the small gap between the underside of the chip 10 and the upper surface of the PC board or substrate 16. As the surface area of the chip 10 increases and/or the gap 15 between the chip 10 and the substrate 16 becomes smaller, it becomes more difficult and time consuming to fully encapsulate all of the electrical interconnections. This may result in incomplete underfill wherein voids 20 in the gap 15 may exist. If such voids are present, then corrosion and undesirable thermal stresses may result which may result in deceased performance or early failures.

It would therefore be desirable to provide a manner of underfilling the gap formed between a flip chip and a substrate, and especially in applications involving larger flip chip geometries and smaller gaps, while preventing any voids or spaces left unfilled between the flip chip and the substrate.

SUMMARY OF THE INVENTION

The present invention overcomes the foregoing and other shortcomings and drawbacks of underfill apparatus and methods heretofore known. While the invention will be described in connection with certain embodiments, it will be understood that the invention is not limited to these embodiments. On the contrary, the invention includes all alternatives, modifications and equivalents as may be included within the spirit and scope of the present invention.

Generally, the invention relates to a method and apparatus for underfilling a gap between a multi-sided semiconductor device and a substrate to encapsulate a plurality of electrical connections formed therebetween. The semiconductor device may comprise a flip chip package having a flip chip mounted to a substrate with a plurality of electrical connections formed in the gap between opposed surfaces of the flip chip and the substrate. According to the method of the present invention, a seal is formed between the semiconductor device and the substrate to seal the gap along multiple sides of the device, while the gap is left unsealed along at least one side of the device to permit fluid communication with the gap. Viscous underfill material is dispensed as an elongated bead adjacent the one side of the semiconductor device along which the gap is unsealed. Thereafter, a pressure differential is created across the elongated bead of underfill material to draw the underfill material into the gap and thereby encapsulate the electrical interconnections formed therebetween. The underfill material may then be cured after the electrical interconnections have been fully encapsulated.

In one aspect of the invention, a fixture member is provided having a top wall and a plurality of side walls depending from the top wall to define a device receiving chamber. The semiconductor device is received within the device receiving chamber so that the top wall and side walls of the fixture member form a seal between the device and the substrate to seal the gap along multiple sides of the device, while the gap is left unsealed along at least one side of the device to permit fluid communication with the gap. A negative pressure source is connected to the device receiving chamber adjacent one of the sides of the device along which the gap is sealed that is opposite to the at least one side of the device along which the gap is unsealed. The negative pressure source creates at least a partial vacuum in the device receiving chamber to draw the viscous underfill material into the gap and thereby encapsulate the semiconductor device package.

In another aspect of the, present invention, a fluid detecting sensor is provided that communicates with the device receiving chamber. The fluid detecting sensor, such as an infrared sensor, is operable to detect the presence of the liquid encapsulant material as it extends beyond the one side of the device that is opposite to the at least one side of the device along which the gap is unsealed. When the liquid encapsulant material is detected by the infrared sensor, the application of negative pressure to the device receiving chamber is terminated, and the device receiving chamber is then vented to atmosphere. In this way, the gap formed between the multi-sided semiconductor device and the substrate is fully underfilled with the liquid encapsulant material to encapsulate the plurality of electrical interconnections formed between the device and the substrate.

From the foregoing summary and the detailed description to follow, it will be understood that the invention provides a unique and effective method and apparatus for underfilling semiconductor devices such as flip chips. The invention is particularly advantageous in flip chip applications in which very small gaps are formed between the flip chip and the substrate or in applications utilizing relatively large flip chips having a large space to underfill. In these situations, the capillary action normally relied upon to move the underfill material into the gap may not be enough to fully encapsulate the electrical connections, and the at least partial vacuum created in device receiving chamber ensures full encapsulation of the semiconductor device package.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENT

Figure 1:
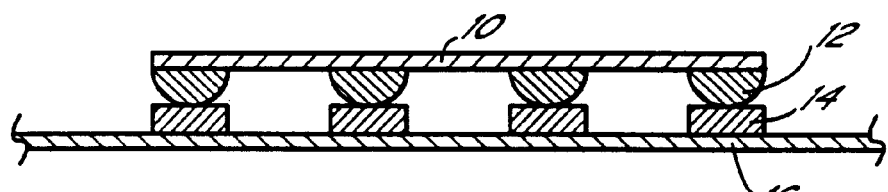
FIG. 1 is a cross sectional view schematically showing a flip chip and substrate prior to a reflow procedure to electrically connect a plurality of solder bumps or balls and solder pads in the prior art.
Figure 2:
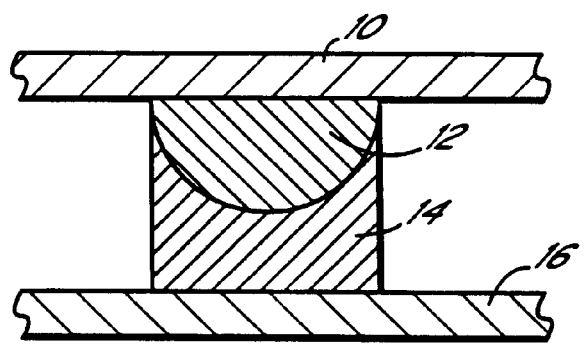
FIG. 2 is an enlarged fragmentary view showing the interconnection of one of the deformed solder pads of FIG. 1 with its corresponding solder ball after reflow in accordance with the prior art.
Figure 3:
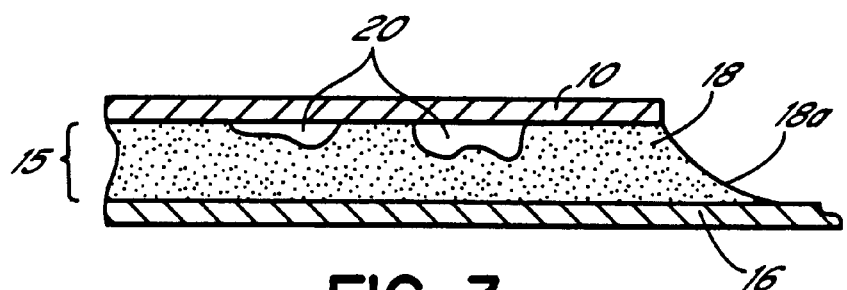
FIG. 3 is an enlarged, fragmentary cross sectional view of the flip chip and substrate of FIG. 1 after an underfilling operation during which voids remain between the flip chip and substrate.
Figure 4:
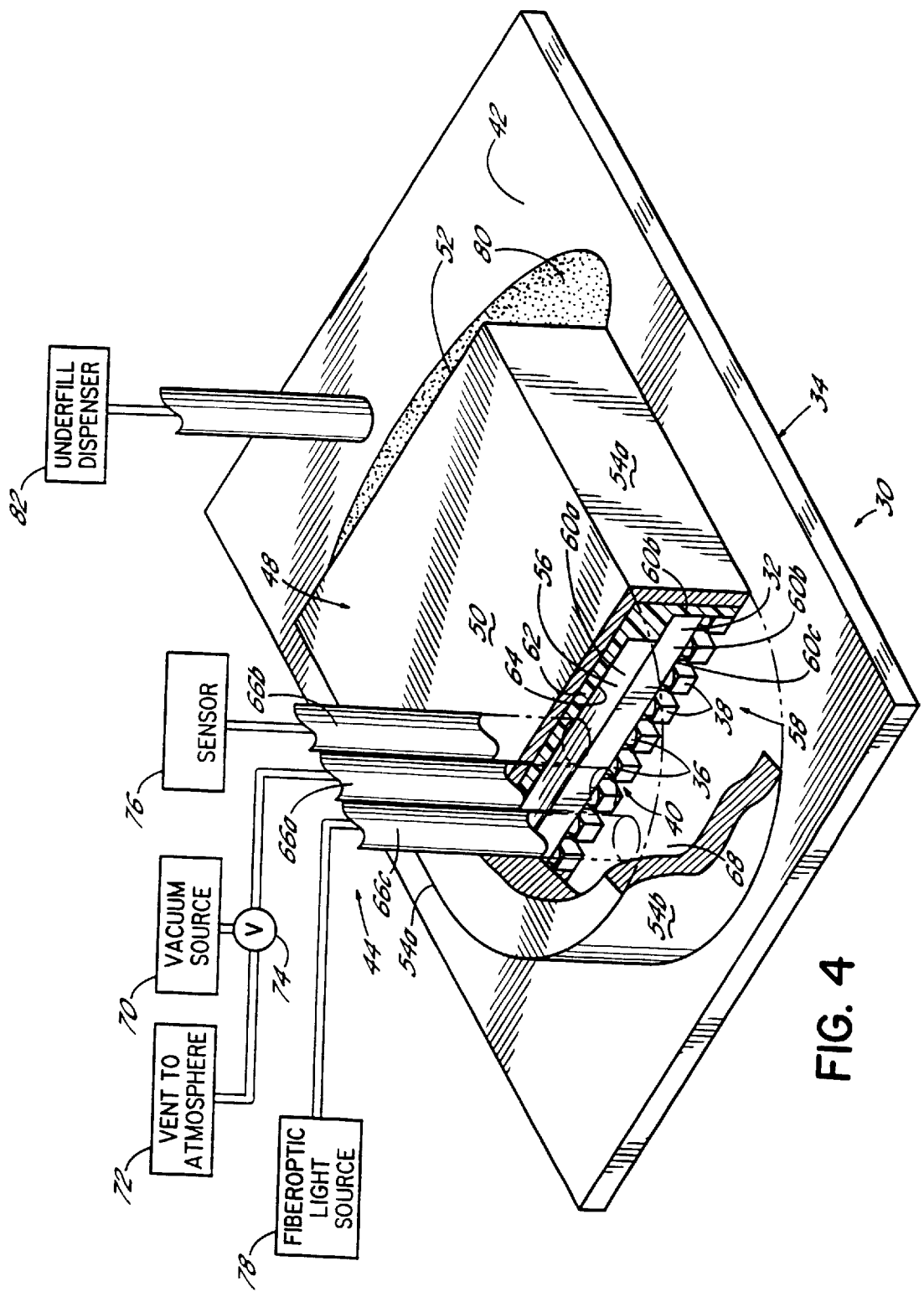
FIG. 4 is a perspective view of a fixture assembly in accordance with the principles of the present invention for underfilling a gap between a multi-sided semiconductor device and a substrate.
Figure 5:
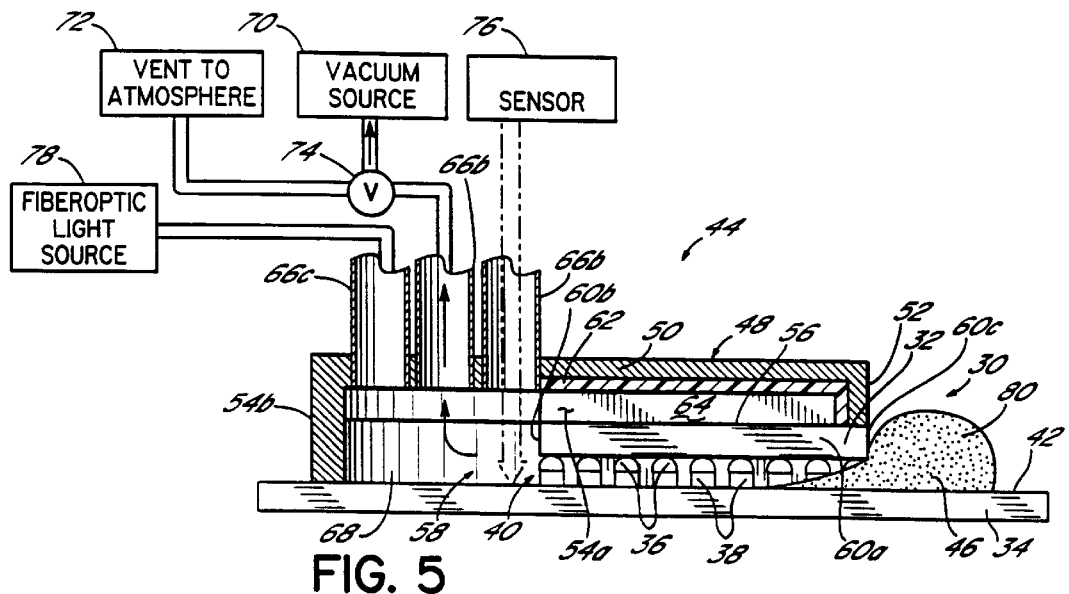
FIG. 5 is a side elevational view, partially in cross section, illustrating the fixture assembly, semiconductor device and substrate during an underfill operation in accordance with the principles of present invention.
Figure 6:
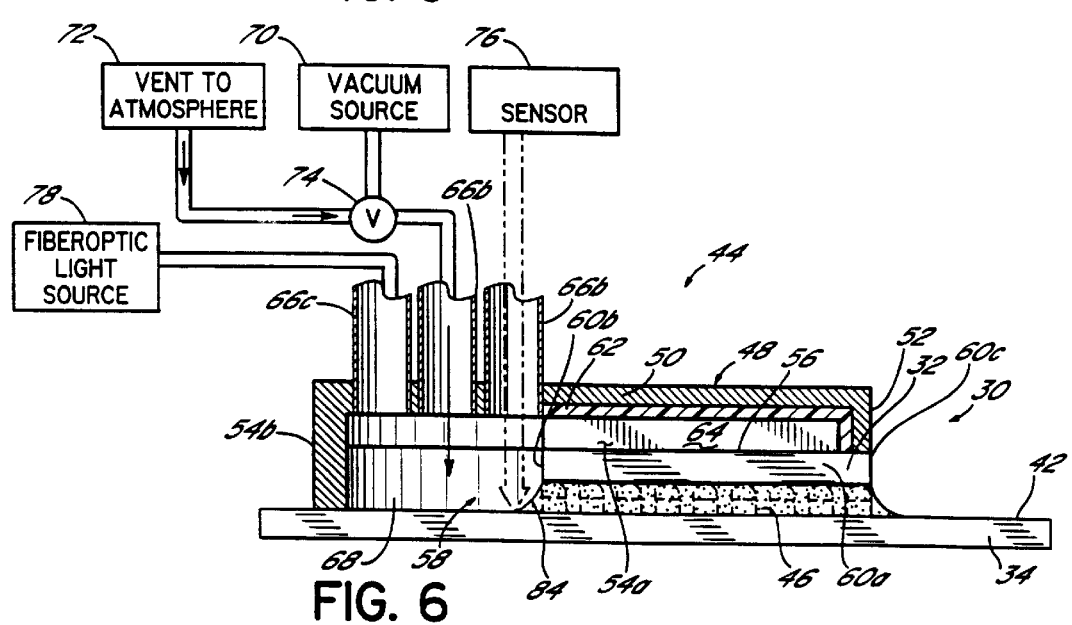
FIG. 6 is a view similar to FIG. 5 illustrating the fixture assembly, semiconductor device and substrate after an underfill operation in accordance with the principles of the present invention.

With reference to the figures, and to FIGS. 4–6 in particular, a semiconductor device package 30 in the form of a flip chip integrated circuit (IC) 32 mounted on a substrate 34 is shown. As those skilled in the art will appreciate, substrate 34 may comprise an organic or ceramic substrate material such as a printed circuit board, a flip chip multi-chip module or a flip chip carrier. The flip chip 32 is electrically and mechanically connected to the substrate 34 through solder bumps or balls 36 on the underside of the flip chip 32 that are registered or aligned with solder pads 38 on the substrate 34. Upon heating, the solder pads 38 on the substrate reflow and physically connect with the solder balls 36 of flip chip 32 to provide a mechanical and electrical interconnection therebetween. With this arrangement, a gap 40 is formed between the underside of the flip chip 32 and the top surface 42 of the substrate 34. As those skilled in the art will appreciate, the gap 40 formed between the flip chip 32 and the substrate 34 may be about 60 microns or less for the larger flip chip die geometries that are being encountered today in semiconductor packaging manufacturing.

In accordance with the principles of the present invention, a fixture assembly 44 is provided to underfill the gap 40 between the flip chip 32 and the substrate 34 with a viscous liquid epoxy encapsulant or underfill 46 (FIGS. 5 and 6). The liquid encapsulant or underfill material 46 is intended to completely fill the gap 40 without any voids. To this end, as shown in FIGS. 4–6, a fixture housing 48 is provided having a top wall 50, a lip wall 52, opposite side walls 54a and an arcuate side wall 54b that is integral with the opposite side walls 54a. The lip wall 52, opposite side walls 54a and arcuate side wall 54b depend from the top wall 50 and are configured so that the lip wall 52 extends from the top wall 50 to substantially the top surface 56 of the flip chip 32, while the side walls 54a, 54b extend from the top wall 50 to substantially the top surface 42 of the substrate 34. The fixture housing 48 may be manufactured from milled aluminum, for example, and is configured so that the top wall 50, lip wall 52 and side walls 54a, 54b define a device receiving chamber 58 for receiving a semiconductor device package, such as the flip chip package 30, within the chamber 58.

Upon placement of the flip chip package 30 within the device receiving chamber 58, the top wall 50 and the side walls 54a, 54b of the fixture housing 48 are adapted to form a seal between the flip chip 32 and the substrate 34 to seal gap 40 along multiple sides 60a and 60b of the flip chip 32, while leaving the gap 40 unsealed along at least one side 60c of the flip chip 32 to permit fluid communication with the gap 40. The lip wall 52 is configured to form a seal with the upper surface 56 of the flip chip 32 adjacent to the side 60c of the flip chip 32 along which the gap 40 is unsealed. It will be appreciated that the configuration of the fixture housing 48 may take many forms, and its configuration is largely dependent on the configuration of the semiconductor device package to be underfilled. Thus, while the present invention will be described herein below in connection with underfilling a four-sided flip chip package 30, the application of the present invention to other semiconductor device encapsulating operations for other types of semiconductor device packages and configurations, such as bail grid arrays, for example, will be readily appreciated without departing from the spirit and scope of the present invention.

To improve the seal of the fixture housing 48 with the flip chip 32 during an underfill operation, the housing 48 includes a molded silicone insert 62 that is attached or otherwise bonded to an inner surface of the housing 48 through conventional means so that the insert 48 at least partially covers the inner surfaces of the top wall 50, lip wall 52, and at least the two opposite side walls 54a of the housing 48. The molded silicone insert 62 may be configured to engage the top surface 56 of the flip chip 32, as well as at least the two opposite sides 60a of the flip chip 32 when the fixture housing 48 is positioned to receive the flip chip 32 within the device receiving chamber 58. The molded insert 62 may be recessed, as indicated generally at 64 (FIG. 4), to minimize contamination of the flip chip top surface 56 during an underfill operation. It will be appreciated that the fixture housing 48 need not engage sides of the flip chip 32 completely along their respective lengths, or even at all, to seal gap 40, such as along side 60b. Thus, while side wall 54b of fixture housing 58 does not engage flip chip 32 along side 60b, gap 40 is still sealed along side 60b.

Still referring to FIGS. 4–6, fixture assembly 44 further includes multiple ports 66a, 66b, and 66c that are connected to the top wall 50 of the fixture housing 48 and that communicate with a portion 68 of the device receiving chamber 58 that is located adjacent to side 60b of the flip chip 32. As will be described in detail below, port 66a is adapted to be selectively and alternatively connected to a source of negative pressure 70 and a vent to atmosphere 72 through a suitable valve 74. Port 66b is adapted to be connected to a fluid detecting sensor 76, while port 66c is adapted to be connected to a light source 78. Each of the ports 66a, 66b and 66c is preferably located adjacent to side 60b of the flip chip 32 along which gap 40 is sealed that is opposite to the side 60c of the flip chip 32 along which gap 40 is unsealed, although other locations of one or more of the ports 66a, 66b and 66c is possible without departing from the spirit and scope of the present invention.

During an underfill operation in accordance with the principles of the present invention, the fixture housing 48 and flip chip package 30 are positioned relative to each other so that the flip chip 32 is received within the device receiving chamber 58 as described in detail above. In this orientation of the fixture housing 48 and flip chip 32, a seal is established between the flip chip 32 and the substrate 34 to seal gap 40 along sides 60a and 60b of the flip chip 32, while gap 40 is left unsealed along side 60c of the flip chip 32 to permit fluid communication with the gap 40. As those skilled in the art will readily appreciate, the flip chip 32 and substrate 34 may be heated prior to the underfill operation. Next, an elongated bead 80 (FIGS. 4 and 5) of liquid encapsulant or underfill 46 is dispensed from an underfill dispenser 82 (FIG. 4) onto the substrate 34 adjacent the side 60c of the flip chip 32 along which gap 40 is unsealed. Alternatively, it is contemplated that the liquid encapsulant 46 may be injected under pressure into the gap 40 adjacent the side 60c of the flip chip 32 along which gap 40 is unsealed. The underfill dispenser 82 may take any form readily known in the art for dispensing liquid encapsulant or underfill material in a desired pattern relative to the flip chip 32.

Upon substantial completion of the dispense cycle by the dispenser 82 to dispense the elongated bead 80 of liquid encapsulant adjacent side 60c of the flip chip 32 along which gap 40 is unsealed, a pressure differential is then created across the bead 80 of material by connection of the negative pressure source 70 to the device receiving chamber 58 through port 66a and valve 74. In this way, one elongated side of bead 80 is subject to the negative pressure, while the opposite elongated side of the bead 80 is subject to atmospheric pressure. Negative pressure from source 70 is applied to the side 60b of the flip chip 32 along which gap 40 is sealed that is opposite to side 60c of the flip chip 32 along which gap 40 is unsealed. The pressure differential created across the length of bead 80 by the negative pressure source 70 causes the liquid encapsulant or underfill material to be drawn into the gap 40 and toward the side 60b of the flip chip 32 as shown in FIG. 5. It has been found that about a five (5) PSI pressure differential is adequate to cause the liquid encapsulant or underfill 46 to fully migrate into the gap 40 of larger flip chip packages having a gap of about 60 microns, although it will appreciated that the pressure differential necessary for encapsulation or underfill is largely dependent on the flip chip package geometry and the viscous characteristics of the liquid encapsulant material used.

In one aspect of the invention, sensor 76 is a light detecting sensor connected to port 66b so that the sensor 76 has a line of site into the portion 68 of the device receiving chamber 58. Light source 78, such as a fiber optic light source, is connected to port 66c to illuminate the top surface 42 of the substrate 34 within the portion 68. In this way, the light detecting sensor 76 is operable to detect a change in surface reflectivity of the substrate 34 as may be caused by the presence of a fillet 84 (FIG. 6) of liquid encapsulant or underfill material as it extends beyond the side 60b of the flip chip 32. When the presence of fillet 84 is detected by sensor 76, thereby indicating that the proper infiltration of liquid encapsulant or underfill material 46 into the gap 40 has been achieved, the application of negative pressure from source 70 through port 66a is terminated and port 66a is then vented to atmosphere through valve 74. Of course, it will be appreciated that a multitude of sensors may be employed in the present invention for detecting the presence of fillet 84 without departing from the spirit and scope of the present invention. For example, an infrared (IR), thermal or motion detector could be employed to detect the presence of the fillet 84, thereby indicating that a proper underfill operation has been achieved. Thereafter, the flip chip 32 is removed from the device receiving chamber 58 so that the next flip chip package may be underfilled. It will be appreciated that the underfilled flip chip package 30 may then be transported for further processing to cure the liquid encapsulant through conventional means.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. For example, while only one fixture assembly 44 is shown, it will be appreciated that a fixture head (not shown) having a plurality of fixture assemblies 44 may be employed to simultaneously underfill a plurality of semiconductor device packages 30. Accordingly, departures may be made from such details without departing from the spirit or scope of applicants' general inventive concept.

We claim:

1. A fixture assembly for underfilling a gap between a multi-sided semiconductor device and a substrate to encapsulate a plurality of electrical connections formed therebetween, comprising:

a fixture member having a top wall and a plurality of side walls depending from said top wall that define a device receiving chamber, wherein said top wall and said side walls are adapted, upon placement of said device within said device receiving chamber, to form a seal between said device and said substrate to seal said gap along multiple sides of said device while leaving said gap unsealed along at least one side of said device to permit fluid communication with said gap; and a first port carried by said fixture member and communicating with said device receiving chamber for connection to a negative pressure source.

2. The fixture assembly of claim 1 wherein said first port is associated with said top wall and located adjacent one of said sides of said device along which said gap is sealed that is located opposite to said at least one side of said device along which said gap is unsealed upon placement of said device within said device receiving chamber.

3. The fixture assembly of claim 1 further comprising a second port carried by said fixture member and communicating with said device receiving chamber for connection to a fluid detecting sensor.

4. The fixture assembly of claim 3 further comprising a fluid detecting sensor connected to said second port.

5. The fixture assembly of claim 3 wherein said second port is associated with said top wall and located adjacent one of said sides of said device along which said gap is sealed that is located opposite to said at least one side of said device along which said gap is unsealed upon placement of said device within said device receiving chamber.

6. The fixture assembly of claim 1 further comprising a third port carried by said fixture member and communicating with said device receiving chamber for connection to a light source.

7. The fixture assembly of claim 6 further comprising a light source connected to said third port.

8. The fixture assembly of claim 6 wherein said third port is associated with said top wall and located adjacent one of said sides of said device along which said gap is sealed that is located opposite to said at least one side of said device along which said gap is unsealed upon placement of said device within said device receiving chamber.

9. The fixture assembly of claim 1 further comprising a polymeric member associated with an inner surface of said fixture member.

* * * * *